United States Patent [19]

Jakob

[11] 3,964,090
[45] June 15, 1976

[54] SEMICONDUCTOR CONTROLLED RECTIFIER

[75] Inventor: Gunter Jakob, Schwabach, Eichwasen, Germany

[73] Assignee: Semikron Gesellschaft fur Gleichrichterbau und Elektronid m.b.H., Nurnberg, Germany

[22] Filed: June 20, 1974

[21] Appl. No.: 481,317

Related U.S. Application Data

[63] Continuation of Ser. No. 318,409, Dec. 26, 1972, abandoned.

[30] Foreign Application Priority Data
Dec. 24, 1971 Germany............................ 2164644

[52] U.S. Cl. .................................. 357/38; 357/20; 357/68; 357/86
[51] Int. Cl.² ......................................... H01L 29/74
[58] Field of Search ................... 357/20, 38, 39, 68, 357/86

[56] References Cited
UNITED STATES PATENTS

| | | | |
|---|---|---|---|
| 3,350,611 | 10/1967 | Scace | 357/86 |
| 3,566,210 | 2/1971 | De Cecco | 357/38 |
| 3,619,738 | 11/1971 | Otsuka | 357/38 |
| 3,633,271 | 1/1972 | Miles et al. | 357/38 |

FOREIGN PATENTS OR APPLICATIONS

| | | | |
|---|---|---|---|
| 1,261,603 | 2/1968 | Germany | 357/38 |
| 935,710 | 9/1963 | United Kingdom | 357/38 |

*Primary Examiner*—Andrew J. James
*Assistant Examiner*—Joseph E. Clawson, Jr.
*Attorney, Agent, or Firm*—Spencer & Kaye

[57] ABSTRACT

A semiconductor controlled rectifier, having a semiconductor body with at least four zones of alternatingly opposite conductivity types, includes a highly doped outer emitter zone of a first conductivity type and a bordering weakly doped inner zone of an opposite conductivity type. The outer emitter zone is formed so as to have a plurality of sections. Portions of the inner zone extend up to the level of the outer surface of the emitter zone between the sections of the emitter zone. These portions of the inner zone are interconnected and bar shaped. The inner zone, therefore, forms a contiguous geometric pattern on the outer surface. A conductive coating is placed on the outer surface and serves as a contact electrode for the rectifier.

7 Claims, 6 Drawing Figures

SEMICONDUCTOR CONTROLLED RECTIFIER

CROSS REFERENCE TO RELATED APPLICATION

This application is a continuation of application Ser. No. 318,409, filed Dec. 26th, 1972.

BACKGROUND OF THE INVENTION

The present invention relates to a semiconductor controlled rectifier having a semiconductor body with at least four zones of alternatingly opposite conductivity types. More particularly, the present invention relates to a semiconductor controlled rectifier of the above-mentioned type wherein at least one of the weakly doped inner zones which is adjacent the outer highly doped emitter zone extends through this emitter zone to its outer surface and is directly connected with a conductive coating disposed on this outer surface which serves as a contact electrode.

When semiconductor controlled rectifiers, i.e. so-called thyristors, are used with voltages of a higher frequency than the conventional line frequency, particular importance is placed on the permissible rate of increase of the voltage $dv/dt$, in addition to the other dynamic properties of these components.

If a thyristor is charged in the forward direction with an increasing voltage, firing, i.e. switching from the nonconductive to the conductive state, may occur, depending on the slope of the voltage curve and the value of the voltage, even before reaching the so-called flip voltage. This phenomenon, which is undesirable in the practical use of these components can be explained in light of the known fact that the two inner highly resistant layers which form the center pn-junction, which is blocking in the forward direction, constitute a voltage dependent capacitance together with their space charge zone. This capacitance may produce an additional shifted current to flow in addition to the static blocking current. The resulting shifted current may be high enough to cause switching of the thyristor. Consequently, such an uncontrolled firing at a steeply increasing voltage occurring in the forward direction has to be prevented by the appropriate reduction of this shifted current.

In 1959, R. W. Aldrich and N. Holonyak, Jr., proposed the use of a four-layer sequence with so-called "shorted emitters" (Journal of Applied Physics, Volume 30, No. 11, November, 1959, page 1819). The metallic electrode which is provided on the emitter surface for contacting the emitter, extends beyond the emitter surface and is also connected with the adjacent p-conductive zone. Such a structure which short-circuits the emitter produces the result that when an increasing voltage is applied in the forward direction, a portion of the majority charge carriers flowing out of the p-conductive zone toward the emitter is drawn directly toward the cathode terminal and can no longer contribute to the injection of minority charge carriers from the emitter zone into the adjacent p-conductive zone and thus to the occurrence of the undesirable switching. Increasing the surface area of the p-conductive zone intended for short-circuiting the emitter leads to an increase in the permissible rate of increase of the voltage $dv/dt$. The surface area cannot be arbitrarily raised, however, due to the mutual arrangement of emitter, p-conductive zone and the contact electrodes disposed on the surface which arrangement is based on various considerations, and due to the requirement for optimum space utilization for a high current load carrying capability.

Embodiments of thyristors with a shorted emitter are also known in which the inner p-conductive zone which borders the emitter zone extends up to the outer surface of the emitter zone through a plurality of separate channels. Each of these channels has a small cross-sectional surface and preferably extends perpendicularly through the emitter zone. This inner p-conductive zone is then directly connected at this outer surface of the emitter zone with the metallic coating serving as the contact electrode. The total surface area indicated as the shorted emitter surface which is determined by the number and respective cross section of these channels, however, reduces the surface area of the emitter zone and thus the current carrying capability in its operation. The surface area of the emitter zone is limited therefore, by this parameter. It has also been found that the $dv/dt$ values do not increase at the same rate as the increase in the shorted emitter surface area. The explanation for this appears to be that the majority charge carriers flowing out of the p-conductive zone in the direction of the emitter zone do not pass in the desired manner through the channels of the known structure toward the contact electrode because each one of these channels, with its narrow cross section as compared to the surrounding emitter surface, determines the intake region for drawing in the charge carriers. Furthermore, increasing the shorted emitter surface area appears to influence the pn-junctions disposed between the emitter zone and the channels of the p-conductive zone.

SUMMARY OF THE INVENTION

An object of the present invention is to improve the permissible rate of increase of the voltage within semiconductor controlled rectifiers having shorted emitters, without adversely influencing the characteristic transmission properties.

This is accomplished according to the present invention in that the emitter zone is provided with a plurality of sections in order for portions of the inner zone to extend between the sections of the emitter zone up to the conductive coating. The portions of the inner zone which extend through the emitter zone include a plurality of interconnected bar-shaped sections which are combined into a contiguous geometric pattern.

BRIEF DESCRIPTION OF THE DRAWINGS

The same designations are chosen for same parts in all figures.

DESCRIPTION OF THE PREFERRED EMBODIMENTS

Figure 1:
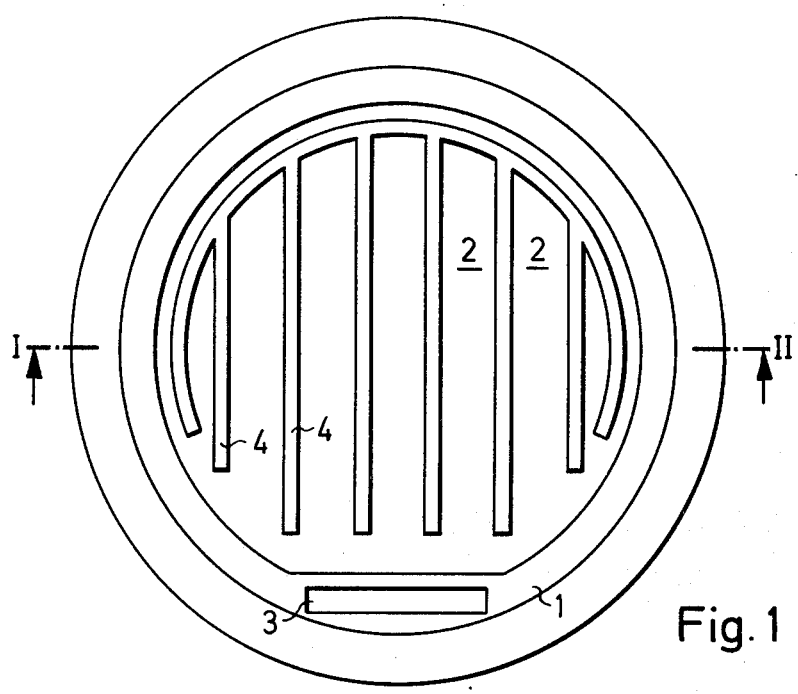
FIG. 1 is a top plan view of a thyristor structure according to the present invention without a contact electrode at the emitter.
Figure 2:
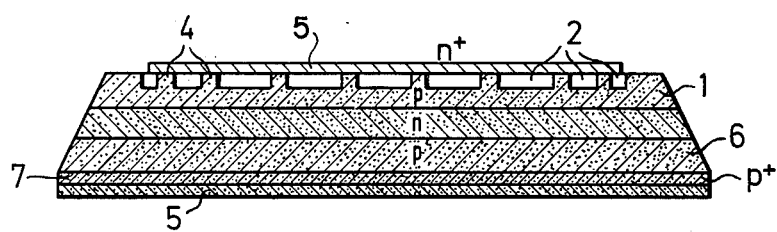
FIG. 2 is a cross-sectional view along the line I-II of FIG. 1 but showing the emitter contact.

As shown in FIG. 2, a conventionally wafer-shaped semiconductor body having, for example, a pnp layer sequence is provided at the outer surface of one of its p-conductive zones 6 with a highly doped $p^+$-conductive layer 7 and at the outer surface of its oppositely disposed p-conductive zone 1 with an $n^+$-conductive emitter zone. Thus, this semiconductor has four zones of alternatingly opposite conductivity types. This emitter zone consists of a plurality of strip-shaped components 2. These components 2 are separated from one another by interconnected long, narrow, i.e. bar-shaped, sections 4, which may be either straight or curved, of the p-conductive zone 1 which extend between the components 2 up to the outer surface of components 2. The sections 4 form a contiguous geometric pattern on the outer emitter surface. Both the components 2 and the sections 4 are contacted with a contact electrode 5 which forms the cathode. Sections 4 of the p-conductive zone 1 are disposed at the same level as the emitter zone and are formed in a comb-shaped arrangement (FIG. 1) and are interconnected to form a contiguous surface so that the p-conductive zone passes through the emitter zone up to the level of the contact electrode coating 5 in the form of a geometric pattern extending over the surface of the emitter zone. One factor in determining the width of sections 4 resides in production considerations, for example, the diffusion depth and the diffusion profile when fabricating the components 2 by means of a diffusion process. A second factor is the requirement that the total surface area of the sections 4 which pass through the emitter zone be as small as possible as compared to the emitter surface area. The mutual spacing between the sections 4 depends on the desired configuration of the shorted emitter and its surface ratio with respect to the emitter surface. Electrode 3 provides a contact for the inner zone 1.

For example, an embodiment of a semiconductor controlled rectifier constructed in accordance with the present invention with the emitter zone having a surface of 20.5 mm in diameter, with the strips 4 of the comb-shaped shorted emitter having a width of 40 $\mu m$ and being spaced 1.2 mm apart, and with the resulting ratio between the surface area of the strips 4 to the emitter surface area being 3.2%, $dv/dt$ values of 1100 V/$\mu$sec and more were obtained, which correspond to 67% of the maximum of a voltage increasing according to an e function. In comparison, a prior known arrangement with separate dot-shaped channels of the p-conductive zone passing through the emitter zone and with a surface ratio of 3.5% resulted in $dv/dt$ values of only about 700 V/$\mu$sec. A surface ratio of 2 to 5% and mutual spacing of the strip-shaped sections 4 up to about 3 mm were found to be particularly favorable for the present invention.

Semiconductor controlled rectifiers with a structure as provided by the present invention can be produced with the desired shape of the shorted emitter, for example, with the aid of a so-called photomask where the structure is copied onto a prepared, preferably oxidized and photolacquer covered wafer of semiconductor material with the appropriate layer sequence for example the layer sequence shown in FIG. 1. In a subsequent etching process, the surface regions of the oxide layer required for the arrangement of the emitter zone components 2 (between sections 4) are removed down to the p-conductive zone 1. The remaining strip-shaped oxide layer portions form the mask for the subsequent diffusion process and are dimensioned so that the highly doped diffused emitter zones disposed between the strips of the oxide layer will be separated from one another by sections 4 of the shorted emitter having the desired expanse based on the diffusion depth and diffusion profile. Thereafter the oxide layer strips are removed and finally the planar surface of the semiconductor wafer at which alternating sections of the emitter zone and the adjacent base zone are arranged next to each other is covered with a conductive coating which serves as the contact electrode 5 and the emitter zone is thereby short-circuited.

Although the present invention has been described for a controlled rectifier having a weakly doped p-conductive base zone 1 and a highly doped n-conductive emitter zone, it is to be understood that the invention can also be used for a four-layer structure with a weakly doped n-conductive base and an adjacent highly doped $p^+$-conductive emitter zone as well as for arrangements with more than four layers of alternatingly opposite types of conductivity.

Instead of the comb-shaped arrangement shown in FIG. 1, the shorted emitter may also be designed, i.e., to be meander or star-shaped, or may have the shape of a ring with inwardly extending spokes.

Figure 3:
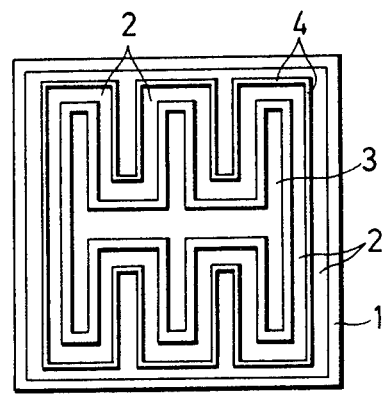
FIGS. 3 to 6 are top plan views of thyristor structures according to this invention with respective other forms of the geometric pattern of the bar-shaped sections forming the so-called shorted emitter.

In FIG. 3 an embodiment of a semiconductor body with rectangular surface and with a meander-shaped pattern of the sections 4 formng the socalled shorted emitter is shown, which is especially suitable for frequency thyristors and turn-off-devices.

The control electrode 3 being shown essentially enlarged is arranged within the emitter zone 2 in the shape of two lined-up H patterns with a common longitudinal bar. In the area between control electrode 3 and the edge of the semiconductor body, at most a possibly small distance from the edge, the shorted emitter consisting of the sections 4 and forming a closed passage of the base zone 1 to the surface of the emitter zone 2 surrounds the control zone 3 meander-shaped, matched to the extent of the same.

Figure 4:
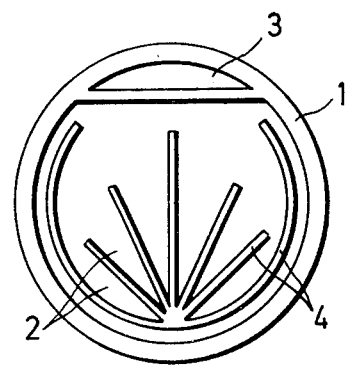

FIG. 4 shows an embodiment with a circular surface, with a mutual arrangement of emitter zone 2 and control electrode 3 according to the representation in FIG. 1 and with a star-shaped pattern of the sections 4. Thereby the center of the pattern is arranged at that section of the emitter zone which is extended at the greatest distance from the control electrode and all of the beams run star-shaped from the edge of the emitter zone into the area of the same. Consequently emitter zone parts 2 which are open in the direction of the control electrode 3 are formed, whereby the switching condition of the device is promoted.

Figure 5:
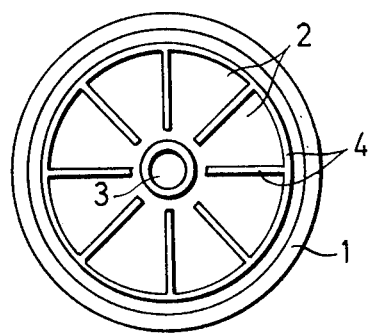

FIG. 5 shows an embodiment of a thyristor structure according to this invention with a central control electrode 3. The sections 4 forming the shorted emitter are arranged in form of a ring, situated on the outer edge zone of the emitter area, with bars running from the same in the direction of the control electrode 3 whereby each of the emitter zone parts 2 in its area from the control electrode toward the outer edge zone, and thus providing a geometric pattern which is favourable for firing.

Figure 6:
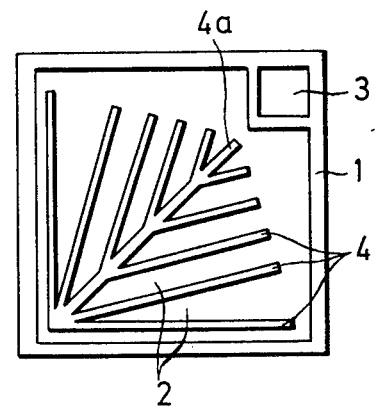

Furthermore in FIG. 6 a structure according to this invention with a square-shaped surface is shown in which the control electrode 3 is arranged in a notch at a corner of the emitter area and in which the sections 4 of the shorted emitter run like a pine-tree-arrangement star-shaped from the corner diagonally oppositely disposed to the electrode 3 and from a central bar 4a diagonally disposed, in a direction toward the sides of the emitter area which partially surround the control electrode 3.

In all of the embodiments according to this invention the total area of the bar-shaped sections 4 should amount to 2 – 5 percent of the emitter area.

It will be understood that the above description of the present invention is susceptible to various modificatons, changes and adaptations, and the same are intended to be comprehended within the meaning and range of equivalents of the appended claims.

I claim:

1. In a semiconductor controlled rectifier having a semiconductor body with a planar outer surface and at least four zones of alternatingly opposite conductivity types including an outer highly doped emitter zone of a first conductivity type at said outer surface and an adjacent inner weakly doped zone of the opposite conductivity bordering the outer emitter zone and having a first portion which extends to said outer surface adjacent said emitter zone and further portions which extend through said outer emitter zone up to said outer surface completely within the perimeter of said emitter zone at said outer surface, said first portion being separated from said further portions at said outer surface by said emitter zone, a control electrode disposed on said outer surface and contacting said first portion of said weakly doped inner zone, and a conductive coating disposed on said outer surface over said emitter zone and serving as a single emitter contact electrode, said single contact electrode being directly connected to said emitter zone and only said further portions of said inner zone so as to form a shorted emitter, the improvement wherein said further portions of said weakly doped inner zone which extend to said outer surface through said emitter zone comprise a plurality of interconnected bar-shaped sections, which are elongated in the plane of said outer surface, and which form a connected geometric pattern at said outer surface, whereby a controlled rectifier with an improved dv/dt behavior is achieved.

2. A semiconductor controlled rectifier as defined in claim 1 wherein said interconnected bar-shaped sections are arranged so that said geometrical pattern is in the form of a comb with the legs thereof extending in a direction toward said control electrode.

3. A semiconductor controlled rectifier as defined in claim 1 wherein said interconnected bar-shaped sections are arranged so that said geometrical pattern is in the shape of a star with each of said bar-shaped sections emanating from a common point and extending from said common point in a direction toward said control electrode.

4. A semiconductor controlled rectifier as defined in claim 1 wherein said interconnected bar-shaped sections are arranged so that said geometrical pattern is in the form of a pine-tree-arrangement wherein a plurality of said bar-shaped sections emanates from a central one of said bar-shaped sections which extends in a direction toward said control electrode.

5. A semiconductor controlled rectifier as defined in claim 1 wherein: said emitter zone has an annular shape at said outer surface; said first portion of said weakly doped inner zone is in the center of said annular shape; and said interconnected bar-shaped sections are arranged so that said geometrical pattern is in the shape of a ring with inwardly extending strokes.

6. A semiconductor controlled rectifier as defined in claim 1 wherein said geometrical pattern is such that the portions of said emitter zone between said further portions of said inner weakly doped zone are all open in a direction toward said control electrode.

7. A semiconductor controlled rectifier as defined in claim 6 wherein said interconnected bar-shaped sections are arranged so that said geometrical pattern is in the form of a meander.

* * * * *

UNITED STATES PATENT AND TRADEMARK OFFICE
CERTIFICATE OF CORRECTION

PATENT NO. : 3,964,090
DATED : June 15th, 1976
INVENTOR(S) : Gunter Jakob

It is certified that error appears in the above-identified patent and that said Letters Patent are hereby corrected as shown below:

In the heading of the patent, under [73] Assignee, change "Elektronid" to --Elektronik--.
Column 4, line 23, change "formng" to --forming--; line 55, after "2" insert --increases--.
Column 5, line 16, before "bordering" insert --type--.
Column 6, line 27, change "strokes" to --spokes--.

Signed and Sealed this

Eleventh Day of January 1977

[SEAL]

Attest:

RUTH C. MASON
Attesting Officer

C. MARSHALL DANN
Commissioner of Patents and Trademarks